United States Patent [19]
Keller

[11] Patent Number: 5,546,408
[45] Date of Patent: Aug. 13, 1996

[54] HIERARCHICAL PATTERN FAULTS FOR DESCRIBING LOGIC CIRCUIT FAILURE MECHANISMS

[75] Inventor: Brion L. Keller, Conklin, N.Y.

[73] Assignee: International Business Machines Corporation, Armonk, N.Y.

[21] Appl. No.: 257,594

[22] Filed: Jun. 9, 1994

[51] Int. Cl.⁶ .................... G06F 11/263; G01R 31/3183
[52] U.S. Cl. .......................... 371/27; 371/22.1; 364/578
[58] Field of Search .............................. 371/23, 22.1, 27, 371/22.3, 22.4, 26, 27; 324/73.1

[56] References Cited

U.S. PATENT DOCUMENTS

| | | | |
|---|---|---|---|
| 4,059,749 | 11/1977 | Felchenfeld | 235/302 |
| 4,099,668 | 7/1978 | Feilchenfeld et al. | 235/304 |
| 4,606,024 | 8/1986 | Glass et al. | 371/16 |
| 4,785,453 | 11/1988 | Chandran et al. | 371/68 |
| 4,802,231 | 1/1989 | Davis | 382/34 |
| 4,853,928 | 8/1989 | Williams | 371/15 |
| 4,937,826 | 6/1990 | Gheewala et al. | 371/22.1 |
| 4,958,347 | 9/1990 | White et al. | 371/29.5 |
| 5,018,144 | 5/1991 | Corr et al. | 371/22.3 |
| 5,099,436 | 3/1992 | McCown et al. | 364/550 |
| 5,189,674 | 2/1993 | Shimizu | 371/20.1 |
| 5,220,662 | 6/1993 | Lipton | 395/575 |
| 5,410,548 | 4/1995 | Millman | 371/23 |

OTHER PUBLICATIONS

IBM Technical Disclosure Bulletin, vol. 31 No. 2, Jul. 1988–Flexible Fault Model for Test Generation–pp. 299–302.

Primary Examiner—Emanuel T. Voeltz
Assistant Examiner—Edward Pipala
Attorney, Agent, or Firm—Perman & Green

[57] ABSTRACT

A method and system (12) for defining and using a pattern fault file (15) having a static pattern fault and/or a dynamic pattern fault. A static pattern fault is represented as a list of required excitation nodes and their values, as well as a fault propagation point. The fault propagation point is defined to be a net or node in a circuit to be tested where the defect's effect first appears once it has been excited. A dynamic pattern fault adds to this structure an initial value list of nodes and their required initial values. The dynamic-pattern fault is employed to advantage when a two pattern sequence is required to excite a specific defect. Logical combinations (AND/OR) of specified pin excitations and fault propagation points may be employed. The excitation value list, the initial value list and the propagation point can include any of the following: input pins of an entity; output pins of the entity; nets inside of the entity; pins on usage blocks inside the entity; nets inside a usage of a lower entity; and pins inside a usage of a lower level entity. The method and system also provide a capability to define pattern faults for each entity in a hierarchial circuit definition, and thus provides a mechanism to define pattern faults for specific cells in a cell technical library (13).

20 Claims, 4 Drawing Sheets

HIERARCHICAL PATTERN FAULTS FOR DESCRIBING LOGIC CIRCUIT FAILURE MECHANISMS

FIELD OF THE INVENTION

This invention relates generally to electronic test equipment and, in particular, to fault modelling techniques for use with logic circuit test equipment.

BACKGROUND OF THE INVENTION

All automatic test generation programs that are known to the inventor require some type of defect model. The defect model is used to identify test stimulus patterns for detecting the modelled defects. The defect model is also employed to ascertain the effectiveness of the generated test stimulus patterns in detecting the defects.

Traditionally a "stuck-at" fault model has been used in the test industry. That is, a defect is modelled as a node or pin that is shorted to (stuck-at) another node or pin, such as a logic one level or a logic zero level. More recently, a transition fault model has been used to model dynamic defects that require a sequence of two test stimulus patterns to excite the defect.

Both of these fault models place the faults on the input and output pins of gate level primitives. The gate level primitives are employed to model the circuit or integrated circuit to be tested. For example, a complex circuit can be modelled as a number of constituent gate level primitives including AND, OR and inverter gates. Furthermore, assemblages of such gates are used to model higher level logic functions, such as various types of latches and multiplexers (MUXes), which are then stored within a library of higher level logic functions. A particular higher level logic function, such as a D-type FF or a two-input MUX, may be referenced a number of times within a given circuit design.

One problem associated with the gate level model is that it becomes difficult to support some higher level primitives, such as latches and XOR gates, due to an uncertainty as to how these primitives may have been actually implemented by the manufacturer. If only a pin fault model is assumed, certain defects that are internal to these higher level primitives may go un-modelled and therefore undetected.

A further problem is presented in that, in many cases, a true circuit defect cannot be adequately represented by a pin fault on a gate. To more accurately represent such defects it is known to instead employ a lower level transistor or switch level circuit model. Although the overall accuracy of fault modeling may be improved by this approach, some accuracy problems still remain. Furthermore, the use of a transistor or switch level circuit model, as opposed to the gate level circuit model, significantly increases the complexity of the fault model, thereby increasing the required time and effort involved in test pattern generation and fault simulation.

In the past, certain faults have been modelled by inserting additional, redundant logic into the circuit model with only certain pin faults active. These active pin faults force the test generation software to produce a specific pattern necessary to excite the defect. Although this approach allows the test generation system to remain at the gate level, as opposed to the transistor level, it still increases the circuit size (because of the additional gates used to contain the special pin faults) and thus increases the effort required to perform test generation and fault simulation.

In an IBM Technical Bulletin, "Flexible Fault Model for Test Generation", vol 31, no. 2, July, 1988 pp 299–302, P. C. Shearon discloses a technique to describe a logic failure for a logic block as an "objective" in terms of the patterns required to test the logic block failure and the expected good and failure responses. However, a capability to test for faults or defects within a logic block is not provided, neither is an ability to logically associate the objectives with one another.

Commonly assigned U.S. Pat. No. 5,018,144 (Corr et al.) entitled "Logic Performance Verification and Transition Fault Detection" is referenced as being of interest for teaching an improvement in a level sensitive scan design (LSSD) test system that enables the performance of both stuck-at and transition fault testing.

U.S. Pat. No. 4,853,928 (Williams) entitled "Automatic Test Generator for Logic Devices" teaches an algebraic recursion process to solve test conditions for sequential and combinatorial logic devices. Only external pin faults are considered by this technique, and defects which may occur within a circuit, are not modelled.

OBJECTS OF THIS INVENTION

It is an object of this invention to provide an improved method and apparatus for modelling and detecting faults within a circuit.

It is a further object of this invention to provide a mechanism to define a pattern fault that enables the modelling of a defect within a circuit, and to further enable the specification of logical combinations of both static and dynamic patterns to detect the presence of a fault.

SUMMARY OF THE INVENTION

The foregoing and other problems are overcome and the objects of the invention are realized by a method and system for defining a "pattern fault" as a static pattern fault or as a dynamic pattern fault. A static pattern fault is represented as a list of required excitation nodes and their values, as well as a fault propagation point. The fault propagation point is defined to be a net or node in a circuit to be tested where the defect's effect first appears once it has been excited. A dynamic pattern fault adds to this structure an initial value list of nodes and their required initial values. The dynamic pattern fault is employed to advantage when a two pattern sequence is required to excite a specific defect.

The system also provides a capability to define pattern faults for each entity in a hierarchial circuit definition, and thus provides a mechanism to define pattern faults for specific cells in a cell library. Any entity in the hierarchy can have a FAULTS=<name> attribute, where the <name> specifies a pattern fault definition file name. During a fault model build phase, this file is processed and creates a set of faults to model additional defects beyond the automatically generated faults (e.g., stuck-at faults) for the primitive gates. These defects are then employed for each instance of that entity in the circuit. By example, if a specific cell is used n times in the circuit description, then any pattern faults defined for that entity are replicated n times.

The excitation value list, the initial value list and the propagation point can include any of the following: input pins of the entity; output pins of the entity; nets inside of the entity; pins on usage blocks inside the entity; nets inside a usage of a lower entity; and pins inside a usage of a lower level entity.

The use of this invention thus provides an ability to reference any internal node of an entity when building a fault model. The use of this invention also enables the required value lists to refer to pins and/or nets on multiple different logic gates, a distinct improvement over conventional fault models that refer to only the pins on a single block or refer to but one or two nets.

The pattern faults may furthermore be logically grouped into ORing and ANDing groups. An ORing group models a defect such that the defect is considered to be detected if at least one of the faults within the group is detected. An ANDing group models a defect such that the defect is considered to be detected only if all of the faults within the group are detected. A partial credit for an ANDing group may be given in a detection status file if at least one of the faults in the group is detected.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
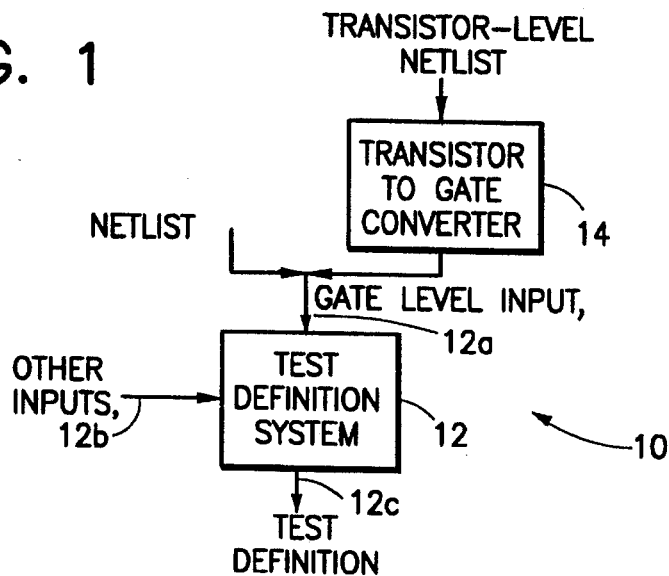
FIG. 1 is a block diagram of a circuit test generation system that is suitable for practicing this invention.

FIG. 1 is a block diagram of a circuit test generation system 10 that is suitable for practicing this invention. System 10 includes a test definition system 12 that operates in accordance with this invention to support the use of user-specified pattern faults. The test definition system 12 receives a netlist at an input 12a, the netlist being a gate level representation of a circuit to be tested. In the preferred embodiment of this invention the netlist is in a well-known gate level Electronic Design Interface Format (EDIF). If a transistor level EDIF netlist is available instead, a converter 14 is employed to convert same to the gate level EDIF netlist.

The test definition system 12 also receives other inputs at the input 12b. These other inputs may include an EDIF technology library, a ROM personality file representing ROM data for each ROM, if any, in the circuit to be tested, a tester description file that identifies the characteristics of the manufacturing test equipment, a test mode file that describes how the circuit to be tested is to be operated when in the test mode, and, in accordance with this invention, a pattern fault file that is used to augment the conventional stuck-at and transition faults that are generated and modelled by the test definition system 12.

The output 12c of the test definition system 12 is a test definition file that is downloaded to the test equipment (not shown) when the circuit is to be tested.

In a preferred embodiment of this invention the system 10 automatically generates pattern faults for certain higher-level primitives such as XOR and Latch blocks. These generated pattern faults are pessimistic in nature and cause a test pattern generator to create all possible input patterns at the inputs of the primitive blocks. This eliminates a requirement to know the details of how the primitive is internally implemented at the gate primitive level. This invention extends this automatic pattern fault generation capability to encompass a user-supplied pattern fault file 15 as described below. In response to the user-supplied pattern fault file 15 the test definition system 12 augments the input to the test pattern generator so as to create test patterns that enable the detection of internal faults that may not be detectable by applying all possible input patterns to the inputs of primitive logic blocks.

Figure 2:
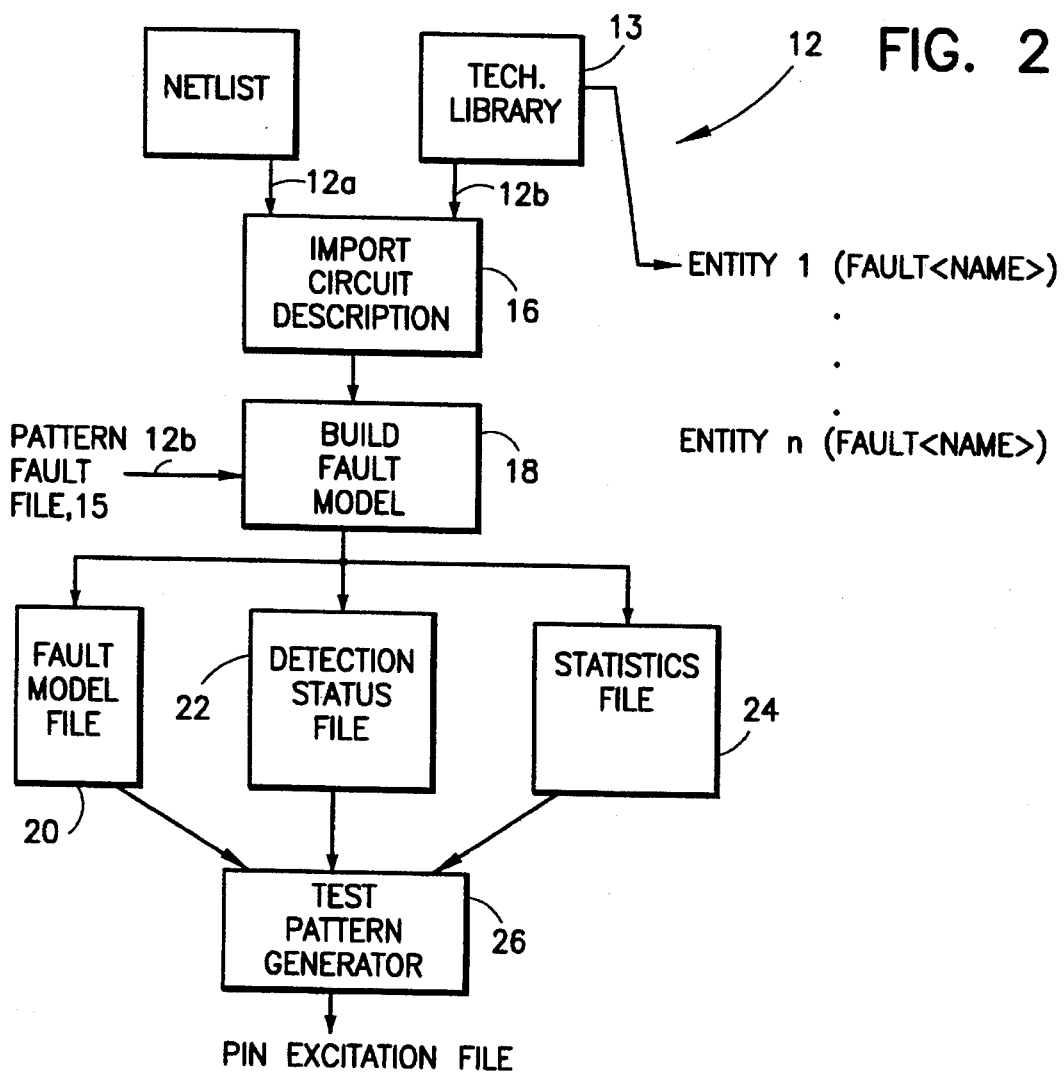
FIG. 2 is a block diagram of the test definition system of FIG. 1.

FIG. 2 is a block diagram of the test definition system 12. An import circuit description block 16 receives as inputs the gate level netlist 12a and also the output 12b of a technical library 13. The technical library 13 stores representations of gate level and higher level primitives such as AND gates and latches. By example, for a netlist reference to an instance of a particular primitive the technical library 13 is accessed to retrieve the corresponding gate level model. The import circuit description block 16 has an output coupled to a build fault model block 18. The build fault model block 18 is also coupled to the other inputs 12b. Of most significance herein is the pattern fault file 15 that is constructed and employed in accordance with this invention. The build fault model block 18 operates on the imported circuit description to generate stuck-at faults and dynamic transition faults for the corresponding gate level model in a conventional manner. In accordance with this invention the build fault model block 18 augments the traditional fault model with faults that are generated in accordance with the pattern fault file 15, as described below. An output of the build fault model block 18 is a fault model file 20, a detection status file 22, and a statistics file 24. Although shown as three separate files, in practice the detection status file 22 and the statistics file 24 may be combined into one file that reflects the overall effectiveness of the generated fault model that is embodied in the fault model file 20. The fault model file 20 is input to a test pattern generator 26 where a test pin excitation file is constructed for use in testing the circuit represented by the netlist 12a.

The fault model file 20 is output as a binary file that is operated on by the test pattern generator 26 to predefine time-ordered sequences of logic states for test system pins (not shown) that are coupled to a circuit to be tested.

Figure 3A:
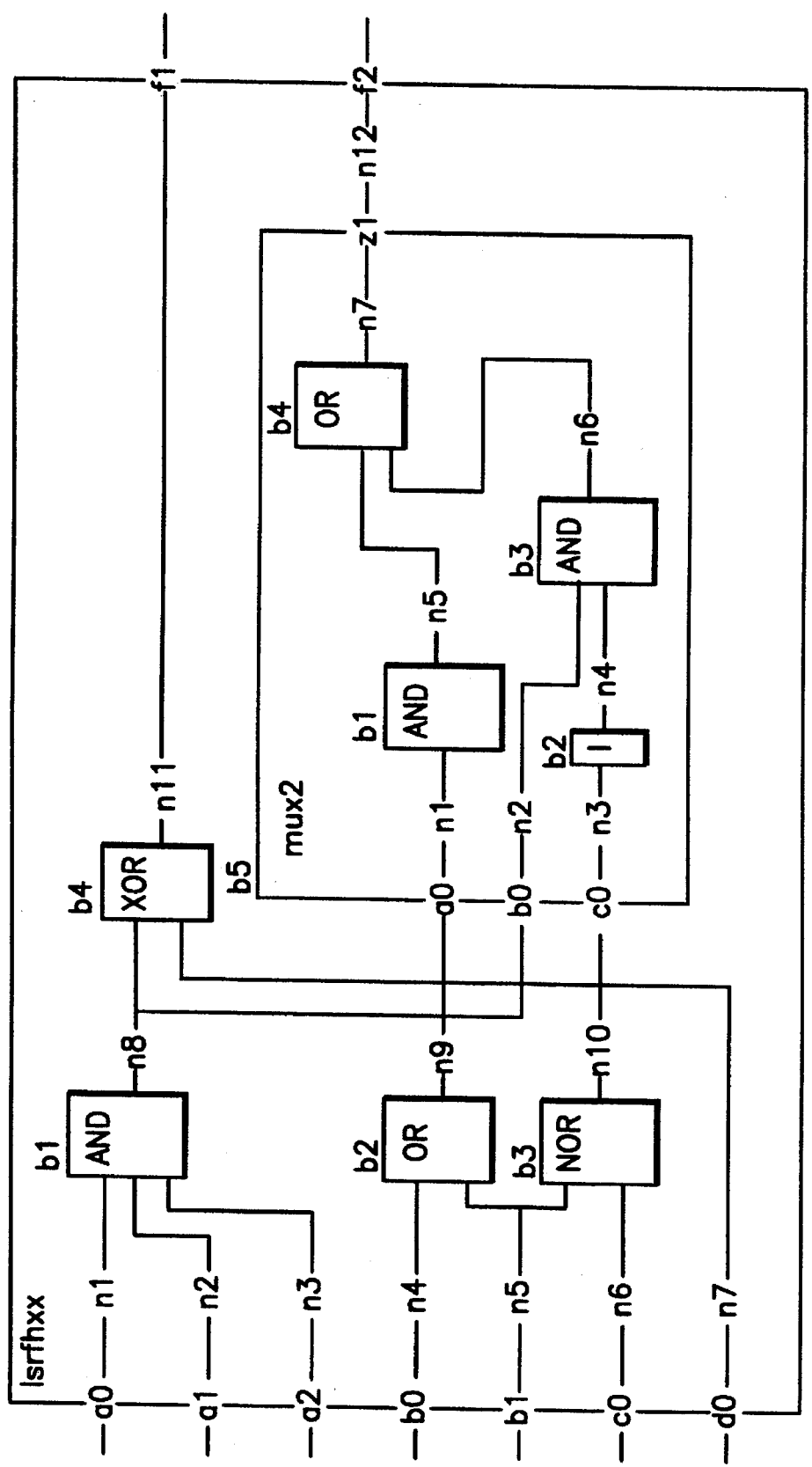
FIG. 3a is a gate level representation of an exemplary circuit model, the model including a higher level primitive.

FIG. 3a is an exemplary circuit that may be represented by the netlist 12a. This circuit is referred to herein as "lsrfhxx". This circuit has a plurality of input nodes (a0, a1, a2 . . . d0) and two output nodes (f1 and f2). During the test of this circuit certain test system pins are preassigned as input pins for connecting to the input nodes, and certain other test system pins are preassigned as output pins for connecting to the output nodes. The circuit contains four gate level primitives b1–b4 and a higher level primitive or sub-circuit (mux2) designated b5. The mux2 is further comprised of four gate level primitives b1–b4, has three input nodes a0, b0, c0, and one output node z1. Internally the lsrfhxx circuit has a plurality of nets designated n1–n12. In addition, the mux2 has a plurality of internal nets designated n1–n7. It should be realized that the lsrfhxx may be one of the higher level primitives that are stored in the technical library 13 of FIG. 2, as may also be the mux2. That is, one or more other instances of the mux2 may be referenced by the netlist at input 12a. In like manner, one or more other instances of the lsrfhxx circuit may be referenced by the netlist at input 12a.

In accordance with an aspect of this invention the pattern fault file 15 is reused by the build fault model block 18 for each instance of the associated logic block within the circuit description embodied within the netlist received on the input 12a.

For the example presented below, it is assumed that the circuit to be tested is represented by the lsrfhxx circuit of FIG. 3a. It should be realized, however, that the circuit to be tested is typically much more complex than the lsrfhxx circuit.

In response to the receipt of the netlist on the input 12a the build fault model block 18 uses conventional fault modelling techniques to model stuck-at faults and dynamic transition faults at the various input and output nodes of the lsrfhxx circuit. In accordance with this invention an ability to model faults internal to the lsrfhxx circuit is also provided through the use of the pattern fault file 15.

Since individual logic cells and macro cells are physically designed before their use in an integrated circuit chip, it is possible to learn beforehand which conductors are routed over each other. Each pair of conductors that cross over one another represents a potential for a short circuit between the two associated nets. Thus, such predetermined shorted net pairings may be provided for such cells through the use of a pattern fault file 15 for that cell. As a result, for each instance of the cell within a particular circuit design the presence of the pattern fault file 15 will cause the build fault model block 18 to model the specified fault(s) and to insure that the resulting fault model file 20 will result in the generation of pin excitations (static or dynamic) that will detect the fault if it is present.

Figure 3B:
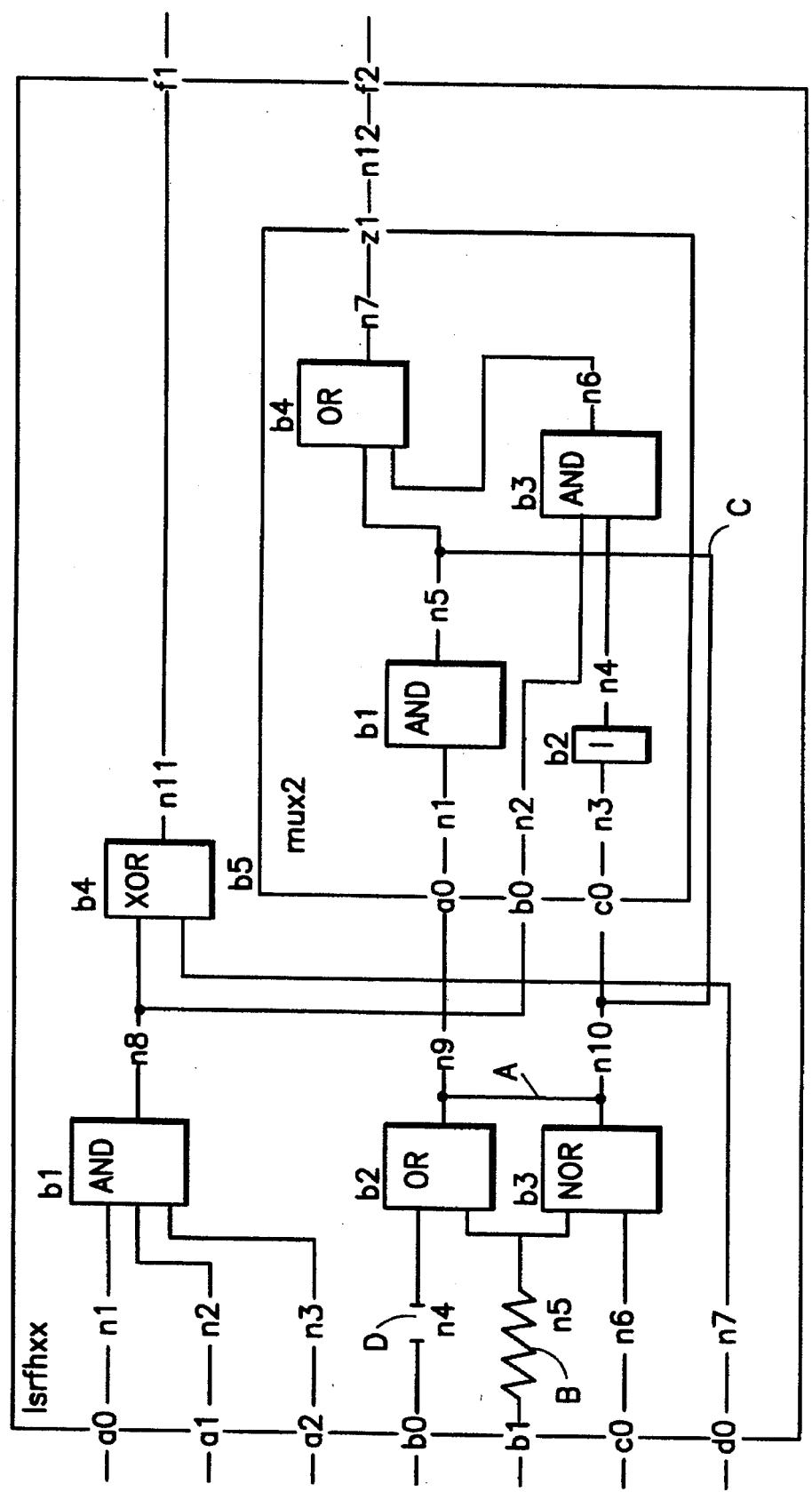
FIG. 3b shows the circuit model of FIG. 3a with a plurality of exemplary faults that are useful in describing the pattern fault method of this invention.

Referring to FIG. 3b, a first internal fault to be modelled (designated A) is a short (wired AND) between nets 9 and 10. This fault may occur as a result of the physical layout of the circuit (e.g., the conductors that represent nets 9 and 10 physically cross one another). A second internal fault (designated B) is a high resistance fault within the net n5. In this case an analysis of the lsrfhxx circuit has determined that this resistive defect causes unpredictable behavior, but that the defect can be detected by applying two specific test patterns as described below. The presence of this fault may cause the corresponding input of the OR (b2) and NOR (b3) to float, thereby resulting in indeterminate behavior at their outputs, nets 9 and 10 respectively. Only if both test patterns (an AND function) yield the expected result can the resistive defect be declared to be not present. A third internal fault (designated C) is a short between net n10 and the net n5 that is internal to the mux2. This fault also results from the actual physical layout of the circuit. In this case analysis indicates that two specific test patterns can cause a defective response from the lsrfhxx circuit, and that either one (an OR function) can be credited with detecting this fault. A fourth (dynamic) internal fault (designated D) is an open in the net n4.

What follows is a format for a presently preferred embodiment of the pattern fault specification (definition) that is input on line 12b to the build fault model block 18 of FIG. 2. The source of the pattern fault file 15 may be a conventional keyboard (not shown) whereby a user keys in the fault definition file as detailed below. Alternately, the pattern fault file 15 may be stored on a disk or some other suitable storage medium, and inputted as required.

The following example is used to specify the four faults (A–D) described above with respect to FIG. 3b. In this example each REQ statement gives the Required values for the defect to be activated. By example, the test pin on input node b0 must be a one, and the test pin on input node b1 must be a zero. The PROP statement indicates to what point (pin or net) that the fault will Propagate, that is, at which location the circuit behavior caused by the fault will first be manifest. For example, PROP{net n10 1/0} indicates that the fault will first be detected at net n10, where the expected (good) value should be a one, while the value resulting from the defect will be a zero. For the dynamic case the INIT statement sets out the Initial pin conditions that are to be established by the test system, for example pin b0 is a one and pin b1 is a zero. The following REQ statement then indicates the pin level transition(s) required to excite the defect, for example, pin b0 transitions to a zero while pin b1 remains a zero. The AND statement indicates to the build fault model block 18 that the following pattern faults must all be detected as good in order to be certain that the defect does not exist, while the OR statement indicates that if only one of the following pattern faults is detected as bad the fault can be reported as being present. Any text located between /*..*/ is treated as a comment and is not processed by the build fault model block 18 Optional text, delimited by "", is also not processed per se, but is instead kept associated with the fault so that it may later be printed out to facilitate a user's understanding of a detected fault.

```
Example:
ENTITY = lsrfhxx       /* ENTITY identifies the circuit */
/*  What follows are all of the static pattern fault
    definitions for the cell lsrfhxx    */
/*  Defect A:       */
    /* Detect a wired AND short between nets n9, n10. */
    SHORT0 {
        NET n9
        NET n10
    }
```

In response to this input the build fault model block 18 builds two static pattern fault entries for nets 9 and 10 in the fault model file 20, one for n9=0 and n10=1 and one for n9=1 and n10=0. These entries would not be created if only conventional stuck-at and dynamic faults were being modelled, in that nets 9 and 10 are internal to the lsrfhxx logic block.

```
/* Defect B:       */
AND {
/* The following two static pattern faults must both be
detected as good (AND function) in order to be certain that
the defect B does not exist. That is, n9 and n10 must both
be a one in response to the associated required inputs in
order to declare that the resistive defect on n5 is not
present   */
    STATIC {
        "internal resistive short to ground on net n5"
        REQ           /* required values       */
        {pin b0 1
         pin b1 0
         net n10 1
        }
        PROP {
         net n10 1/0      /* fault effect         */
        }
    }
    STATIC {
        "internal resistive short to ground on net n5"
        REQ
        {pin b0 0
         pin b1 1
         pin c0 1
```

```
        net n9  1
        }
    PROP {
        net n9  1/0        /* fault effect         */
        }
    }
} /* end AND      */
/* Defect C:      */
OR {
    /* Either one of the following two satic pattern faults
       detects the presence of the resistive short between
       net n10 and the net n5 that is internal to mux2.  */
    STATIC  {
        "internal resistive short between net n10 and net
        b5.n5"
        REQ
            {net n10 1
            net b5.n7 0
            }
        PROP {
            net b5.n7 0/1   /* fault effect        */
            }
    }
    STATIC  {
        REQ
            {net n10 0
            net b5.n5 1
            }
        PROP {
            net n10 0/1     /* fault effect        */
            }
    }
} /* end OR       */
/* The following are dynamic faults.  */
/* Defect D:      */
OR { /* the following two dynamic pattern faults represent
         one defect detected by either pattern fault */
    DYNAMIC {
        "open on net n4"
        INIT {
            PIN b0   1      /* initial conditions for b0 and b1 */
            PIN b1   0
        }
        REQ {
            PIN b0   0      /* b0 transitions one to zero   */
            PIN b1   0      /* while b1 remains zero        */
        }
        PROP {net n9  0/1}  /* fault effect        */
    }
    DYNAMIC {
        INIT {
            PIN b0   0
            PIN b1   0
        }
        REQ {
            PIN b0   1      /* b0 transitions zero to one   */
            PIN b1   0      /* while b1 remains zero        */
        }
        PROP {net n9  1/0}  /* fault effect        */
    }
} /* end OR */
```

If desired, further patterns can be employed to propagate a fault to an external pin of the lsrfhxx logic block. For example, the last mentioned zero defect state at net 9 can be propagated through the mux2 block to the output node f2 by the application of suitable logic states to input nodes a0, a2, a3 (via the AND b1), and by establishing the proper logical state at n10.

The system also provides a capability to define pattern faults for each entity in a hierarchial circuit definition, and thus provides a mechanism to define pattern faults for specific logic cells in the technical library 13. Any entity in the circuit definition hierarchy may have a FAULTS= <name> attribute, where the <name> specifies a pattern fault definition file name. During the fault model build phase, this file is processed and creates a set of faults to model additional defects beyond the automatically generated faults (e.g., stuck-at faults) for the primitive gates. These defects are then employed for each instance of that entity in the circuit. By example, if a specific cell, such as the lsrfhxx or the mux2 is used n times in the circuit description, then any pattern faults defined for that entity are replicated n times.

In view of the foregoing Example it can be appreciated that the teaching of this invention enables the modelling of defects for a given logic block that require, for detection, the use of logic values on pins or nets on completely different logic blocks. In addition, the required values to excite a defect can be placed either on pins (e.g., I/O pins of the entity containing the pattern faults) or on internal nets of that entity (including nets internal to a lower level of hierarchy).

Figure 4:
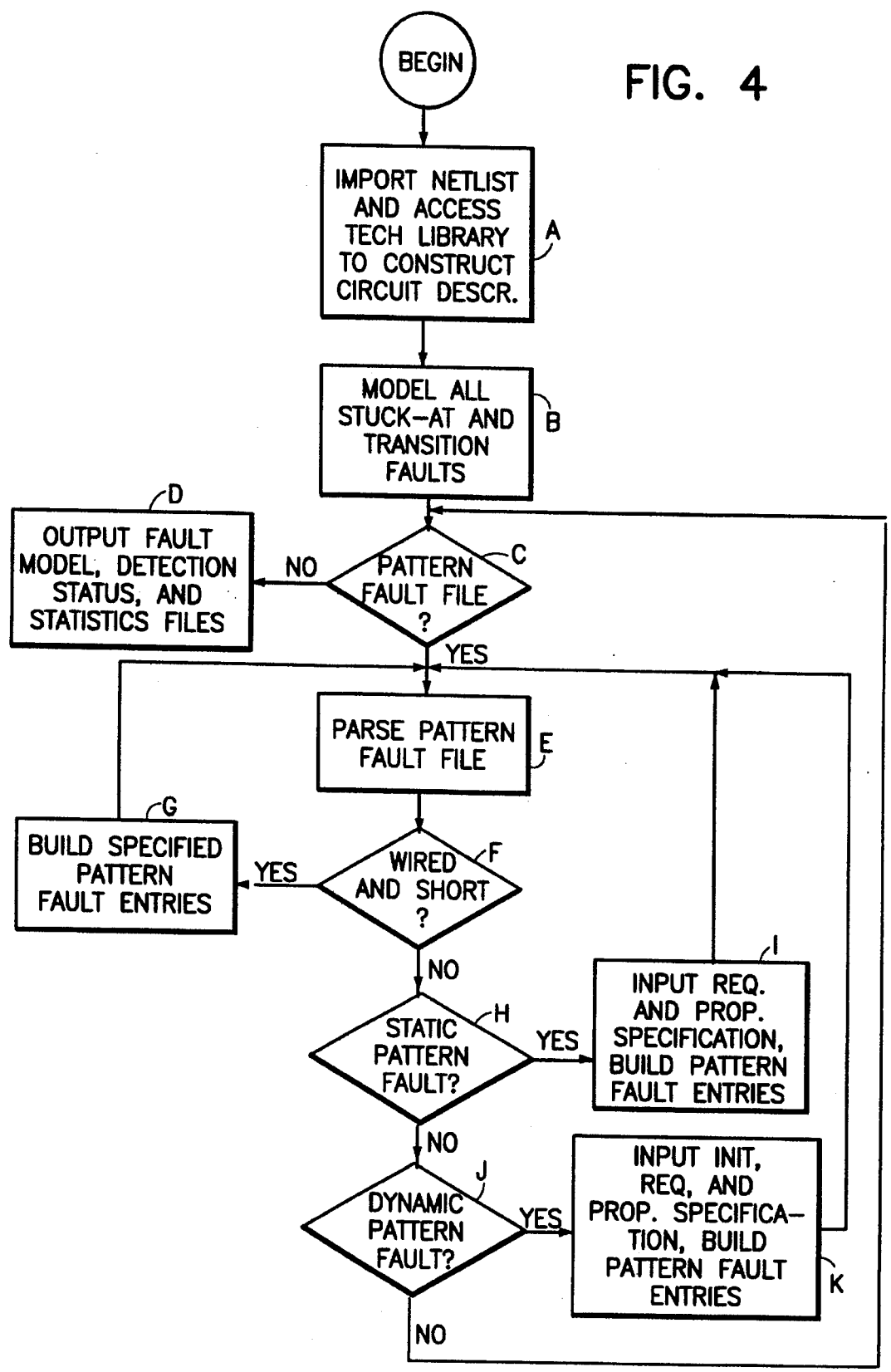
FIG. 4 is a logic flow diagram of a presently preferred method of this invention.

FIG. 4 is a logic flow diagram of a presently preferred method of this invention. In particular, FIG. 4 illustrates a method for operating the build fault model block 18 of FIG. 2.

At Block A the netlist is imported and the technical library 13 is accessed to retrieve the specified logic elements to build the circuit description. At Block B the build fault model block 18 models all stuck-at and transition faults in a conventional manner. In so doing, the fault model file 20, the detection status file 22, and the fault statistics file 24 are created and developed. At Block C a determination is made if a first or a further pattern fault file 15 remains to be processed. If No, control passes to Block D where the fault model, detection status, and statistics files are output to the test pattern generator 26. If Yes at Block C, control passes to Block E where the pattern fault file 15 is parsed. At Block F a determination is made if a wired AND short is specified. If Yes, control passes to Block G where the build fault model block 18 generates the specified pattern fault entries as described above and thus updates the fault model, detection status, and statistics files. Control then passes back to Block E to continue parsing the pattern fault file 15. If No at Block F control passes to Block H where a determination is made if the pattern fault file 15 entry specifies a static pattern fault. If Yes, control passes to Block I where the REQ and PROP specifications are entered, and the indicated pattern fault entries are inserted into the fault model file 20, the detection status file 22, and the statistics file 24. Control then passes to Block E to continue parsing the pattern fault file 15. If No at Block H control passes to Block J where a determination is made if the pattern fault file 15 entry specifies a dynamic pattern fault. If Yes, control passes to Block K where the INIT, REQ and PROP specifications are entered, and the indicated pattern fault entries are inserted into the fault model file 20, the detection status file 22, and the statistics file 24. Control then passes to Block E to continue parsing the pattern fault file 15. If No at Block J it is assumed that this instance of the pattern fault file 15 has been parsed, and control is transferred to Block C to determine if another instance of a pattern fault file 15 exists for the circuit. During subsequent testing of the circuit the test system operates so as to execute all of the specified stuck-at and transition fault tests, in addition to the tests specified by the pattern fault file 15. This includes the testing of nodes or nets that are internal to the circuit under test, and logical combinations of these tests, if so specified.

In summary, the teaching of this invention provides an ability to use internal nets, and not just pins, of a block of logic. This is especially useful when it is desired to reference nets internal to a lower level entity (such as the mux2) within the entity (such as the lsrfhxx) for which the pattern fault is being defined. The teaching of this invention also provides an ability to OR and AND groups of faults to model a single defect.

The teaching of this invention also provides an ability to define both static and dynamic pattern faults for any entity in the hierarchy of a circuit design, and to thus cause the fault model to contain these pattern faults for each usage of the entity in the circuit design.

The teaching of this invention also provides an ability to define shorted net defects for circuits whose physical design is known to cause certain conductors to overlap.

Although described in the context of a presently preferred embodiment of this invention it should be realized that a number of modifications can be made to the described embodiment, and that these modifications will still fall within the teaching of this invention. For example, in FIG. 4 a number of the steps may be executed in other than the order shown while still achieving the same end result. Also by example, other formats than that shown in the foregoing Example for expressing the pattern fault file 15 may occur to those skilled in the art. Further by example, and although the pattern fault file 15 has been described in the context of a user-analysis of the circuit to be tested and the subsequent generation of the pattern fault file 15 to cover potential faults uncovered by this analysis, it is within the scope of this invention to automatically generate the pattern fault file 15 with a suitably programmed data processor. As but one example, an expert system developed to identify potential internal faults based on circuit layout and/or on the previous test history of the circuit can be employed to generate the pattern fault file 15 for input to, or as a part of, the build fault model block 18.

As such, although the invention has been particularly shown and described with respect to a preferred embodiment thereof, it will be understood by those skilled in the art that changes in form and details may be made therein without departing from the scope and spirit of the invention.

Having thus described my invention, what I claim as new, and desire to secure by Letters Patent is:

1. A method for specifying a test sequence for a circuit, the circuit being modelled to have a plurality of external contact nodes, a plurality of internal nets, and at least one sub-circuit having input/output nodes connected to the internal nets, comprising the steps of:

modelling possible first faults associated with the external contact nodes, the plurality of internal nets, and the input/output nodes of the at least one sub-circuit;

modelling only specified ones of possible second faults associated with at least one of one or more of the internal nets and one or more nets that are internal to the at least one sub-circuit; and generating a specification of a sequence of test pin excitations that are predetermined to detect the presence of the possible first and second faults.

2. A method as set forth in claim 1 wherein the step of modelling specified ones of possible second faults includes a step of specifying a logical association between individual ones of the modeled possible second faults.

3. A method as set forth in claim 2 wherein the logical association includes an AND function and an OR function.

4. A method as set forth in claim 1 wherein the step of modelling specified ones of possible second faults includes a step of providing a pattern fault file that specifies at least one of a wired AND fault, a static pattern fault, and a dynamic pattern fault.

5. A method as set forth in claim 4 wherein for a specified wired AND fault the step of providing provides a list of nets.

6. A method as set forth in claim 4 wherein for a static pattern fault the step of providing provides a list of required excitation values for the fault to be activated and a location within the circuit where the effect of the fault will be detected.

7. A method as set forth in claim 6 wherein the step of providing the location also provides an indication of an expected logic value at the location if the fault is not present and an expected logic value at the location if the fault is present.

8. A method as set forth in claim 4 wherein for a dynamic pattern fault the step of providing provides a list of required initial excitation values, a list of required transitions from the initial excitation values for the fault to be activated, and a location within the circuit where the effect of the fault will be detected.

9. A method as set forth in claim 4 wherein the circuit has the pattern fault file associated therewith, and wherein for each instance of the circuit within a larger circuit the possible second faults that are specified by the pattern fault file are modelled.

10. A method as set forth in claim 1 wherein the step of modelling specified ones of possible second faults includes a step of specifying a first sequence of pin excitations to excite a fault, a step of specifying a second sequence of pin excitations to excite the fault, and a step of establishing a logical OR function between the first and second sequences of pin excitations such that the fault will be considered to be detected if either of the sequences of pin excitations excites the fault.

11. A method as set forth in claim 1 wherein the step of modelling specified ones of possible second faults includes a step of specifying a first sequence of pin excitations to excite a fault, a step of specifying a second sequence of pin excitations to excite the fault, and a step of establishing a logical AND function between the first and second sequences of pin excitations such that the fault will be considered to be detected only if both of the sequences of pin excitations excites the fault.

12. Apparatus for specifying a test sequence for a circuit, comprising:

means, responsive to a netlist, for modelling a circuit to be tested to have a plurality of external contact nodes, a plurality of internal nets, and at least one sub-circuit having input/output nodes connected to the internal nets;

first means, responsive to the modelled circuit, for modelling possible first faults associated with the external contact nodes, the plurality of internal nets, and the input/output nodes of the at least one sub-circuit;

second means, responsive to a pattern fault file, for modelling specified ones of possible second faults associated with at least one of one or more of the internal nets and one or more nets that are internal to the at least one sub-circuit; and means, responsive to the operation of the first and second modelling means, for generating a specification of a sequence of test pin excitations that are predetermined to detect the presence of the possible first and second faults.

13. Apparatus as set forth in claim 12 wherein said second modelling means is responsive to the fault pattern file for specifying a logical association between individual ones of the modeled possible second faults.

14. Apparatus as set forth in claim 13 wherein the logical association includes an AND function and an OR function.

15. Apparatus as set forth in claim 12 wherein said second modelling means is responsive to a pattern fault file that specifies at least one of a wired AND fault, a static pattern fault, and a dynamic pattern fault.

16. Apparatus as set forth in claim 15 wherein for a specified wired AND fault the pattern fault file provides a list of nets.

17. Apparatus as set forth in claim 15 wherein for a static pattern fault the pattern fault file provides a list of required excitation values for the fault to be activated, a location within the circuit where the effect of the fault will be detected, and an indication of an expected logic value at the location if the fault is not present and an expected logic value at the location if the fault is present.

18. Apparatus as set forth in claim 15 wherein for a dynamic pattern fault the pattern fault file provides a list of required initial excitation values, a list of required transitions from the initial excitation values for the fault to be activated, a location within the circuit where the effect of the fault will be detected, and an indication of an expected logic value at the location if the fault is not present and an expected logic value at the location if the fault is present.

19. A method for establishing a test for a circuit, the circuit being modelled to have a plurality of external contact nodes, a plurality of internal nets, and at least one sub-circuit having input/output nodes connected to the internal nets, comprising the steps of:

modelling at least one of possible first faults associated with the external contact nodes, the plurality of internal nets, and the input/output nodes of the at least one sub-circuit;

modelling at least one of possible second faults associated with at least one of the internal nets and one or more nets that are internal to the at least one sub-circuit; and specifying first excitations to excite a modelled fault;

specifying second excitations to excite the modelled fault; and establishing at least one of (a) a logical OR function between the first and second sequences of excitations such that the modelled fault will be considered to be detected if either of the sequences of excitations excites the modelled fault, and (b) a logical AND function between the first and second sequences of excitations such that the modelled fault will be considered to be detected only if both of the sequences of pin excitations excites the modelled fault.

20. A method as set forth in claim 19 wherein the step of modelling at least one possible second fault includes a step of providing a pattern fault file that specifies at least one of a wired AND fault, a static pattern fault, and a dynamic pattern fault.

* * * * *